United States Patent
Sagal et al.

(10) Patent No.: US 6,681,487 B2
(45) Date of Patent: Jan. 27, 2004

(54) METHOD OF MANUFACTURING A COMPOSITE OVERMOLDED HEAT PIPE

(75) Inventors: E. Mikhail Sagal, Watertown, MA (US); Kevin A. McCullough, Warwick, RI (US); James D. Miller, Marietta, GA (US)

(73) Assignee: Cool Options, Inc., Warwick, RI (US)

( * ) Notice: Subject to any disclaimer, the term of this patent is extended or adjusted under 35 U.S.C. 154(b) by 0 days.

(21) Appl. No.: 10/123,363

(22) Filed: Apr. 16, 2002

(65) Prior Publication Data

US 2003/0019103 A1 Jan. 30, 2003

Related U.S. Application Data

(63) Continuation of application No. 09/774,519, filed on Jan. 31, 2001, now Pat. No. 6,585,039.
(60) Provisional application No. 60/179,500, filed on Feb. 1, 2000.

(51) Int. Cl.[7] ................................................ B23P 15/00
(52) U.S. Cl. .............................. 29/890.032; 29/890.03; 29/527.1
(58) Field of Search ........................ 29/890.032, 890.03, 29/527.1; 165/104.33, 80.3, 185, 104.26; 257/715; 361/700; 264/239, 241

(56) References Cited

U.S. PATENT DOCUMENTS

| | | | |
|---|---|---|---|
| 4,099,556 A | | 7/1978 | Roberts, Jr. ................. 165/96 |
| 4,523,636 A | * | 6/1985 | Meijer et al. ........... 165/104.26 |
| 4,791,142 A | * | 12/1988 | Pleuse et al. ................. 521/50 |
| 4,874,800 A | | 10/1989 | Minamisawa et al. ...... 523/205 |
| 4,912,548 A | * | 3/1990 | Shanker et al. ............. 257/715 |
| 4,950,360 A | | 8/1990 | Murao et al. ................ 156/668 |
| 4,971,142 A | | 11/1990 | Mergler ................. 165/104.14 |
| 4,997,724 A | | 3/1991 | Suzuki et al. ............... 428/626 |
| 5,046,553 A | * | 9/1991 | Lindner .................. 165/104.26 |
| 5,213,153 A | * | 5/1993 | Itoh ........................ 165/104.33 |
| 5,216,580 A | * | 6/1993 | Davidson et al. ............ 361/700 |
| 5,253,702 A | * | 10/1993 | Davidson et al. ........... 165/80.4 |
| 5,268,414 A | | 12/1993 | Nakai et al. ................. 524/539 |
| 5,314,010 A | * | 5/1994 | Sakaya et al. .......... 165/104.26 |
| 5,469,330 A | | 11/1995 | Karabatsos et al. .......... 361/704 |
| 5,598,632 A | * | 2/1997 | Camarda et al. ....... 29/890.032 |
| 5,660,758 A | * | 8/1997 | McCullough ................. 249/59 |
| 5,667,870 A | * | 9/1997 | McCullough ................ 428/131 |
| 5,720,338 A | * | 2/1998 | Larson et al. ................. 165/46 |
| 5,720,339 A | | 2/1998 | Glass et al. ............. 165/104.26 |
| 5,769,154 A | * | 6/1998 | Adkins et al. .......... 165/104.26 |
| 5,803,161 A | | 9/1998 | Wahle et al. ........... 165/104.21 |
| 5,847,925 A | * | 12/1998 | Progl et al. .................. 361/687 |
| 5,848,637 A | * | 12/1998 | Lee ........................ 165/104.21 |
| 5,884,693 A | * | 3/1999 | Austin et al. ........... 165/104.33 |
| 5,918,469 A | | 7/1999 | Cardella ......................... 62/3.7 |
| 5,964,279 A | | 10/1999 | Mochizuki et al. .... 165/104.33 |
| 6,014,315 A | * | 1/2000 | McCullough et al. ....... 361/704 |
| 6,048,919 A | | 4/2000 | McCullough |
| 6,075,696 A | | 6/2000 | Progl et al. .................. 361/687 |
| 6,093,961 A | * | 7/2000 | McCullough ................. 257/718 |
| 6,139,783 A | * | 10/2000 | McCullough ............... 264/40.1 |
| 6,149,969 A | | 11/2000 | Gibson ......................... 427/142 |
| 6,212,352 B1 | | 4/2001 | Kagawa et al. ............. 399/307 |
| 6,224,610 B1 | | 5/2001 | Ferrera ........................ 606/108 |

FOREIGN PATENT DOCUMENTS

| | | |
|---|---|---|
| JP | 404-225791 A | 8/1992 |
| SU | 1326-867 A | 10/1985 |

* cited by examiner

*Primary Examiner*—I. Cuda Rosenbaum
(74) *Attorney, Agent, or Firm*—Barlow, Josephs & Holmes, Ltd.

(57) ABSTRACT

The present invention discloses a method of constructing a heat pipe that includes providing a heat pipe with phase change media therein and injection overmolding the heat pipe with a conductive composition. The thermally conductive composition absorbs or reflects electro magnetic interference waves and prevents their transmission into and through the heat pipe to the electronic components being cooled by the heat pipe.

19 Claims, 1 Drawing Sheet

METHOD OF MANUFACTURING A COMPOSITE OVERMOLDED HEAT PIPE

PRIORITY CLAIM TO PREVIOUSLY FILED APPLICATION

This application claims benefit of Provisional appl. 60/179,500 filed Feb. 1, 2000 which is a continuation of and claims priority to application Ser. No. 09/774,519, filed Jan. 31, 2001 U.S. Pat. No. 6,585,039.

BACKGROUND OF THE INVENTION

The present invention relates generally to the cooling of heat generating surfaces and objects. More specifically, the present invention relates to apparatuses for dissipating heat generated by such objects. In addition, the present invention relates to cooling of heat generating objects by use of composite materials, phase change devices and apparatus without the use of external fans to assist in cooling while also shielding such devices from the harmful effects of electromagnetic interference (EMI) waves.

In industry, there are various parts and components that generate heat during operation. For example, in the electronics and computer industries, it is well known that computer components generate heat during operation. Various types of electronic device packages and integrated circuit chips, such as the PENTIUM central processing unit chip (CPU) manufactured by Intel Corporation and RAM (random access memory) chips are such devices that generate heat. These devices, particularly the CPU microprocessor chips, generate a great deal of heat during operation, which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

There are a number of prior art methods to cool heat generating components and objects to avoid device failure and overheating, as discussed above. A block heat sink or heat spreader is commonly placed into communication with the heat-generating surface of the object to dissipate the heat there from. Such a heat sink typically includes a base member with a number of individual cooling members, such as fins, posts or pins, to assist in the dissipation of heat. The geometry of the cooling members is designed to improve the surface area of the heat sink with the ambient air for optimal heat dissipation. The use of such fins, posts of pins in an optimal geometrical configuration greatly enhances heat dissipation compared to devices with no such additional cooling members, such as a flat heat spreader.

It is also known to employ heat pipes to improve the overall performance of a heat spreader or heat sink. A heat pipe is typically a closed ended tubular metal body that is charged with a phase change media, such as water or ammonia. One end of the heat pipe is placed in communication with a heat-generating object while the opposing end is placed in a heat-dissipating zone, such as exterior to a computer case or proximal to a fan assembly. The heat-generating object heats up the phase change media within the heat pipe to a vapor state. The heated media then naturally migrates toward a cooler region of the heat pipe, namely the end opposite to that affixed to the heat-generating object. As a result, the media within the pipe transfers heat from one point to another.

In the prior art, the construction of these heat pipes are very well known. However, due to their delicate tubular construction, the heat pipe outer surface is constructed from metallic tubing for added strength and heat dissipating properties. The drawback is that this construction also creates a very effective antenna for receiving and transmitting EMI waves. This property is undesirable because, since the heat pipe is generally in direct contact with sensitive electronic components, the EMI waves that are received can be transmitted directly to the electronic components, interfering with their operation. To address this problem, it has been known to employ an additional component for shielding the entire assembly from the effects of EMI waves. These EMI shields consist of a metallic shield installed over and in close proximity to the surface of the electronic components to be shielded. However, the addition of another component is expensive and time consuming and due as a result of its construction, restricts airflow around the electronic components further preventing effective cooling.

As an alternative to heat pipes and to further enhance airflow and resultant heat dissipation, active cooling in the form of electric fans has been used, either internally or externally. However, these external devices consume power and have numerous moving parts. As a result, heat sink assemblies with active devices are subject to failure and are much less reliable than a device that is solely passive in nature.

It has been discovered that more efficient cooling of electronics can be obtained through the use of passive devices that require no external power source and contain no moving parts. It is very common in the electronics industry to have many electronic devices on a single circuit board, such as a motherboard, EMI shield, modem, or "processor card" such as the Celeron board manufactured by Intel Corporation. Again, the EMI shields contribute to component overheating by retaining heat due to their proximity to the heat generating components and therefore need efficient and effective cooling as do the CPUs discussed above.

In the heat sink industries, it has been well known to employ metallic materials for thermal conductivity applications, such as heat dissipation for cooling semiconductor device packages and for constructing EMI shields. For these applications, the metallic material typically is tooled or machined from bulk metals into the desired configuration. However, such metallic conductive articles are typically very heavy, costly to machine and are susceptible to corrosion. Further, the geometries of machined metallic heat dissipating articles are very limited to the inherent limitations associated with the machining or tooling process. As a result, the requirement of use of metallic materials which are machined into the desired form, place severe limitations on heat sink design particular when it is known that certain geometries, simply by virtue of their design, would realize better efficiency but are not attainable due to the limitations in machining metallic articles.

In view of the foregoing, there is a demand for a heat pipe construction that is capable of dissipating heat. There is a demand for a heat pipe construction with no moving parts that can provide heat dissipation without the use of active components. In addition, there is a demand for a composite heat pipe construction that can provide greatly enhanced heat dissipation over prior art passive devices with the ability to also absorb and dissipate EMI waves to prevent their transmission back into the component being cooled. There is a further demand for a heat pipe construction that can provide heat dissipation in a low profile configuration while obviating the need for additional EMI shielding components.

SUMMARY OF THE INVENTION

The present invention preserves the advantages of prior art heat dissipation devices and heat pipes. In addition, it provides new advantages not found in currently available devices and overcomes many disadvantages of such currently available devices.

The invention is generally directed to the novel and unique composite heat pipe construction that is constructed by over molding a conventional heat pipe with a thermally conductive polymer composition having electromagnetic interference (EMI) absorptive properties. The present invention relates to a composite overmolded heat pipe for dissipating heat from a heat generating source, such as a computer semiconductor chip, electromagnetic interference (EMI) shield, or other electronic components.

The heat pipe construction of the present invention has many advantages over prior art heat pipe constructions in that additional overmolded heat dissipating structure can be employed to enhance the overall thermal conductive and performance of the heat pipe while absorbing potentially harmful EMI waves without transmitting them to the device being cooled. The composite heat pipe construction of the present invention includes a heat pipe with phase change media therein with a thermally conductive, EMI absorptive composition is molded about the heat pipe. Alternatively, EMI reflective compositions may also be used. The overmolded material, while completely encasing the heat pipe, may also be molded into flat surfaces at each end to provide better contact and thermal communication with the heat generating surface of the electronic component at one end and a heat dissipating surface of a heat sink device at the other.

Further, since the molded heat exchanger is injection molded, there is tremendous flexibility in the arrangement of the components over the known methods of interconnecting components as in prior art assemblies.

A single heat pipe is preferably employed but multiple heat pipes may be embedded within the construction of the present invention. The optional flat contact ends are thermally interconnected to the heat pipe by over molding a thermally conductive polymer material which achieves greatly improved results and its far less expensive than soldering a heat pipe to a heat spreader.

It is therefore an object of the present invention to provide an improved composite heat pipe construction that can provide enhanced heat dissipation for a heat generating component or object.

It is an object of the present invention to provide a heat pipe construction that can provide heat dissipation for semiconductor devices on a circuit board, such as a motherboard or video card.

It is a further object of the present invention to provide a heat pipe construction device that has no moving parts.

Another object of the present invention is to provide a heat pipe construction device that is completely passive and does not consume power.

A further object of the present invention is to provide a heat pipe construction that inexpensive to manufacture.

Another object of the present invention is to provide a heat pipe construction that has a thermal conductivity greater that conventional heat sink designs while providing EMI shielding to the components being cooled.

A further object of the present invention is to provide a composite heat pipe construction that is moldable and is easy to manufacture.

Yet another objective of the present invention is to provide a molded heat spreader construction that has a low profile configuration that provides EMI shielding without sacrificing thermal transfer efficiency.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
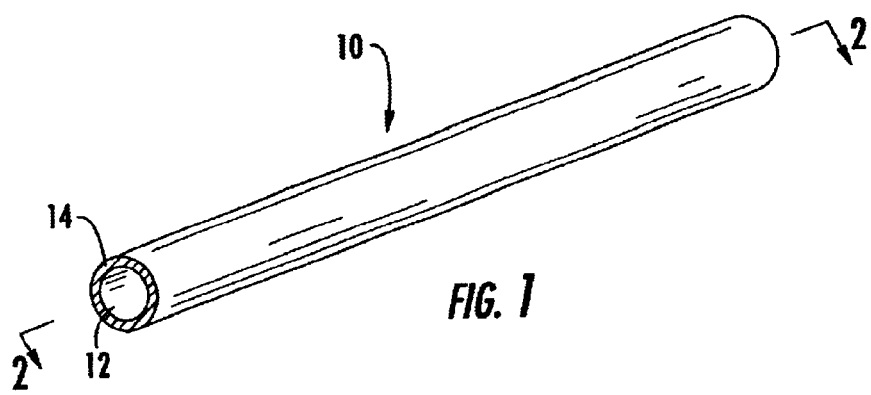
FIG. 1 is a perspective view of the composite heat pipe construction of the present invention.
Figure 2:
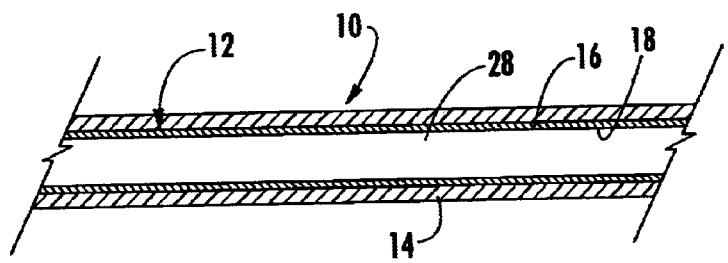
FIG. 2 is a general cross-sectional view through line 2—2 of FIG. 1.

Referring to FIGS. 1 and 2, the composite heat pipe construction 10 of the present invention is shown. The construction 10 includes a heat pipe 12, with phase change media 28 contained therein, that provides a centrally positioned heat transfer member that is overmolded with a layer of moldable thermally conductive material 14, such as a thermally conductive polymer composite material. Preferably, the composite material is molded around the heat pipe 12 and completely encases the entire heat pipe 12 to provide a unitary net-shape molded heat pipe configuration 10. As best seen in FIG. 2, the polymer composite material 14 is molded over the outer surface 18 of the outer metallic tube 16 of the heat pipe 12 to achieve a unitary composite heat pipe configuration 10.

The thermally conductive material 14 is preferably a conductive polymer composition that includes a base polymer of, for example, a liquid crystal polymer that is loaded with a high aspect ratio conductive filler material, such as carbon fiber. Additionally, a second, low aspect ratio filler material, such as boron nitride grains may also be added to the base matrix to further enhance the thermally conductive properties of the composite. Other base materials and conductive fillers may be used and still be within the scope of the present invention.

The composite material 14 thus created has inherent properties that enable it to absorb EMI waves. This effect is desirable when the composite material 14 is employed for encasing the heat pipe 12. Since the outer casing 16 of the heat pipe 12 is metallic, it acts as an antenna receiving and conducting EMI waves throughout its metallic casing 16. This transmission of EMI waves throughout the heat pipe 12 can result in malfunction and damage to the electronic components being cooled by the heat pipe 12. As a result of providing the composite coating 14 over the heat pipe 12 in the present invention, EMI waves are absorbed and harmlessly dissipated by the composite coating 14. In certain applications, an EMI reflective composition may be employed for composite coating 14.

Figure 3:
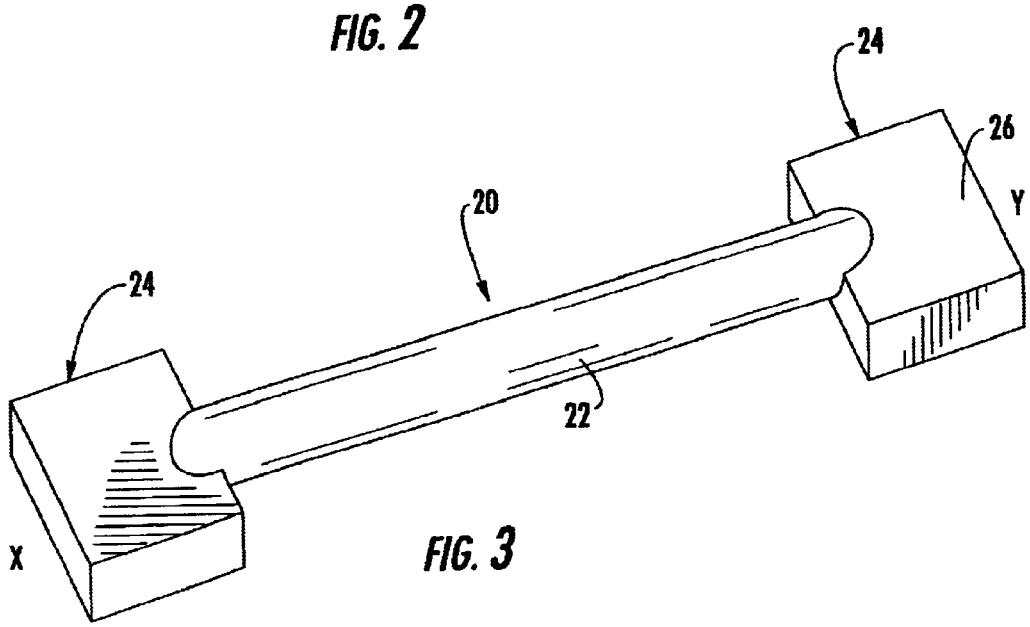
FIG. 3 is a perspective view of an alternative embodiment of the composite heat pipe construction of the present invention.

Turning now to FIG. 3, an alternative embodiment 20 of the present invention is shown. The construction of the overmolded heat pipe 22 proceeds the same as in the preferred embodiment as described above providing a heat pipe 12 and over molding the outer surface 18 of the heat pipe 12 with a coating of thermally conductive polymer 14. In addition, during the over molding process, contact pads 24 are integrally molded from a thermally conductive polymer with the integral coating 14 over the heat pipe 12 resulting in a net-shape over molded heat pipe 20 that can be immediately incorporated into the resulting device. Flat upper surfaces 26 are provided on the contact pads 24 which are intended to be installed in contact with heat generating surfaces of electronic components, such as microprocessor chips, on one end X and heat dissipating components, such as heat sinks, on the other end Y, allowing the free and passive thermal conduction from X to Y.

The heat pipe 20 of the present invention may be affixed to a surface to be cooled in a fashion similar to the way a conventional heat spreader is affixed to a surface to be cooled. The upper surface 26 of the contact pad 24 is mated with the surface to be cooled on one end X and the surface to dissipate the heat on the other end Y. Further, fasteners (not shown), such as threaded screws, may be provided to secure the heat pipe contact pads 24 to a surface. The heat pipe 20 may also be affixed to a surface with thermally conductive adhesive. Other different types of fasteners and connection methods may be employed for this purpose, such as spring clips and clamps.

Since the heat pipe construction 20 of the present invention is net-shape molded which means that after molding it is ready for use and does not require additional machining or tooling to achieve the desire configuration of the heat pipe part 20. With the assistance of the heat pipe 12 and the overmolded thermally conductive composition 14, the present invention provides an improved heat pipe where the heat is spread more evenly and effectively through the body of the heat pipe construction 20.

A described above, the ability to injection mold a thermally conductive device rather than machine it has many advantages. Although not shown, additional fins or pins may be integrally molded into the side of the heat pipe construction 10 of thermally conductive material to further enhance cooling and heat dissipation of the construction.

It should be understood that the applications shown in FIGS. 1, 2 and 3 are merely an example of the many different applications of the present invention and are for illustration purposes only. The composite heat pipe of the present invention is shown in a straight configuration; however, any configuration may be employed to suit the application and device environment at hand, such as Z-shaped or meandering configuration.

It would be appreciated by those skilled in the art that various changes and modifications can be made to the illustrated embodiments without departing from the spirit of the present invention. All such modifications and changes are intended to be covered by the appended claims.

What is claimed is:

1. A method of manufacturing a heat pipe construction with integral shielding against electromagnetic interference, comprising the steps of:

provided a tubular pipe containing heat pipe media; said tubular pipe having an outer surface, a first end and a second end; and overmolding a thermally conductive, electromagnetic interference absorbtive polymer composition around said outer surface of said tubular pipe; said polymer composition being a polymer composite material loaded with a first thermally conductive filler having a high aspect ratio and a second thermally conductive filler having a low aspect ratio.

2. The method of claim 1, wherein said step of providing a tubular pipe comprises providing a tubular pipe manufactured of metal.

3. The method of claim 1, wherein said polymer composite material is a liquid crystal polymer.

4. The method of claim 1, wherein said first thermally conductive filler is carbon fiber.

5. The method of claim 1, wherein said second thermally conductive filler is boron nitride grains.

6. The method of claim 1, wherein said step of forming said material around said heat pipe further includes forming integral thermal interface pads around said first and second ends of said tubular pipe.

7. The method of claim 1, wherein said heat pipe media is water.

8. The method of claim 1, wherein said heat pipe media is ammonia.

9. A method of manufacturing a heat pipe construction with integral shielding against electromagnetic interference, comprising the steps of:

providing a metallic tubular pipe containing heat pipe media said tubular pipe having an outer surface, a first end and a second end;

providing a polymer base matrix;

mixing said polymer base matrix with thermally conductive, electromagnetic interference absorbtive filler material to form a thermally conductive, electromagnetic interference absorbtive polymer composition; said filler material includes a first thermally conductive filler having a high aspect ratio and a second thermally conductive filler having a low aspect ratio; and molding said thermally conductive, electromagnetic interference absorbtive polymer around said outer surface of said tubular pipe.

10. The method of claim 9, wherein said base polymer matrix material is a liquid crystal polymer.

11. The method of claim 9, wherein said first thermally conductive filler is carbon fiber.

12. The method of claim 9, wherein said second thermally conductive filler is boron nitride grains.

13. The method of claim 9, wherein said step of molding said material around said heat pipe further includes forming integral thermal interface pads around said first and second ends of said tubular pipe.

14. A method of manufacturing a heat pipe construction, comprising the steps of:

providing a tubular pipe containing heat pipe media; said tubular pipe having an outer surface, a first end and a second end;

overmolding a thermally conductive polymer composition around said outer surface of said tubular pipe to form an outer covering around said pipe;

overmolding a first thermal interface pad, integrally formed from said polymer composition, adjacent to said first end of said pipe; and overmolding a second thermal interface pad, integrally formed from said polymer composition, adjacent to said second end of said heat pipe.

15. The method of claim 14, wherein said step of providing a tubular pipe comprises providing a tubular pipe manufactured of metal.

16. The method of claim 14, wherein said thermally conductive polymer composition is a polymer composite material loaded with a first thermally conductive filler having a high aspect ratio and a second thermally conductive filler having a low aspect ratio.

17. The method of claim 16, wherein said polymer composite material is a liquid crystal polymer.

18. The method of claim 16, wherein said first thermally conductive filler is carbon fiber.

19. The method of claim 16, wherein said second thermally conductive filler is boron nitride grains.

* * * * *